(12) United States Patent
Polnyi

(10) Patent No.: US 7,364,435 B2
(45) Date of Patent: Apr. 29, 2008

(54) ELECTRICAL CONNECTOR HOUSING HAVING STYLIZED GUIDE BOX

(75) Inventor: Igor Polnyi, Aurora, IL (US)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 11/509,133

(22) Filed: Aug. 24, 2006

(65) Prior Publication Data

US 2008/0050942 A1  Feb. 28, 2008

(51) Int. Cl.
*H01R 12/00* (2006.01)

(52) U.S. Cl. .......................... 439/68; 439/69; 439/70; 439/71; 439/330

(58) Field of Classification Search ............ 439/68–72, 439/330
See application file for complete search history.

(56) References Cited

U.S. PATENT DOCUMENTS

| 4,668,032 | A | * | 5/1987 | Bouvier et al. | 439/68 |
| 5,702,255 | A | * | 12/1997 | Murphy et al. | 439/71 |
| 5,742,481 | A | * | 4/1998 | Murphy et al. | 361/767 |
| 5,877,554 | A | * | 3/1999 | Murphy | 257/727 |
| 6,012,929 | A | * | 1/2000 | Matsumura | 439/70 |
| 6,020,635 | A | * | 2/2000 | Murphy | 257/727 |
| 6,213,787 | B1 | * | 4/2001 | Murphy | 439/71 |
| 6,313,530 | B1 | * | 11/2001 | Murphy | 257/727 |
| 7,056,130 | B1 | * | 6/2006 | McAlonis et al. | 439/71 |
| 7,094,069 | B1 | * | 8/2006 | Saydam et al. | 439/70 |
| 7,220,134 | B2 | * | 5/2007 | Goodman et al. | 439/70 |
| 2006/0046530 | A1 | * | 3/2006 | Wang | 439/70 |

* cited by examiner

*Primary Examiner*—Renee Luebke
*Assistant Examiner*—Vanessa Girardi
(74) *Attorney, Agent, or Firm*—Wei Te Chung

(57) ABSTRACT

An electrical connector includes an insulative housing (10) adapted to engage conductive terminals, and having an IC package mating surface (101) and an opposite substrate mounting surface (103). A rigid strip (12), in a substantially wavy, is attached to and configured to surround peripheral walls of the insulative housing. The rigid strip includes a first series of spaced protrusion portions (120) extending above the IC package mating surface so as to define a receiving cavity therebetween for receiving an IC package, and a second series of spaced protrusion portions (122) extending below the substrate mounting surface with at least four spaced protrusion portions around four corners of the insulative housing disposed in a substantially coplanar manner to function as standoffs. Such a configuration and shape of the rigid strip will have the function of reinforcing the insulative housing while not taking up much more "real estate" of the substrate.

11 Claims, 2 Drawing Sheets

ELECTRICAL CONNECTOR HOUSING HAVING STYLIZED GUIDE BOX

BACKGROUND OF THE INVENTION

1. Field of the Invention

The present invention relates to the art of electrical connectors, and more particularly to an electrical connector provided with a peripheral frame for reinforcing an insulative housing of the electrical connector.

2. General Background

Continued advances in the design of electronic devices for data processing and communications systems have placed rigorous demands on the design of electrical connectors. Specifically, electrical connectors having higher densities and pin counts are needed for design advances which increase integration of solid state devices and which increase the speed of data processing and communication. Designing connectors to have higher densities and higher pin counts requires careful consideration of the problems, which result from the increased pin counts. The number of contact elements that can reasonably withstand the mating and unmating forces is referred to as the pin count. Generally, an insulative housing is employed to hold the contact elements therein. The increasing number of contact elements held within the insulative housing of an electrical connector will require much more load force to be exerted onto the contact elements, which in turn require the insulative housing to have enough strength to receive the load force. Many solutions have been developed for reinforcing the insulative housing. One solution is to attach a reinforcing frame or stiffener to the insulative housing. Such a stiffener may have a substantially rectangular frame defining an opening for grasping outer walls of the insulative housing, with a predetermined clearance set between the outer walls of the insulative housing and the stiffener for some considerations of mechanical connection. On the other hand, the whole connector with such a stiffener attached thereto will in deed take up much more "real estate" of a substrate, which is allotted for active and/or positive components to be equipped thereon. Therefore, there is a need to provide a new electrical connector to solve the above problems.

SUMMARY OF THE INVENTION

An electrical connector according to an embodiment of the present invention includes an insulative housing and a rigid strip. The insulative housing is adapted to engage conductive terminals, and has peripheral walls, an IC package mating surface and a substrate mounting surface opposite to the IC package mating surface. The rigid strip is of a substantially wavy shape. The rigid strip is attached to and configured to surround the peripheral walls of the insulative housing. The rigid strip includes a first series of spaced protrusion portions extending above the IC package mating surface so as to define a receiving space therebetween for receiving an IC package, and a second series of spaced protrusion portions extending below the substrate mounting surface with at least four spaced protrusion portions in the second series around four corners of the insulative housing disposed in a substantially coplanar manner while having their heights greater than those of the remaining protrusion portions respectively so as to function as standoffs. As compared with the prior art, since the rigid strip is directly attached to the peripheral outer walls of the insulative, such a configuration and shape of the rigid strip will have the function of reinforcing the insulative housing while not taking up much more "real estate" of the substrate, which is allotted for active and/or positive components to be equipped thereon.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
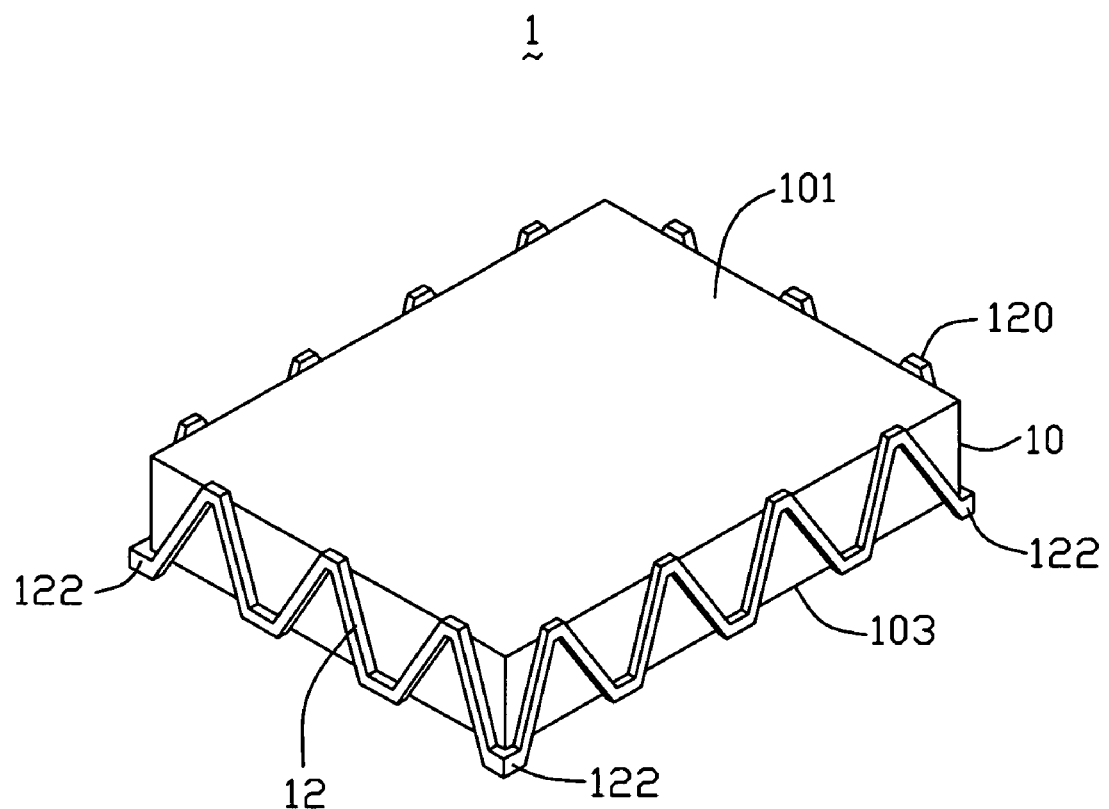
FIG. 1 is a schematic, perspective view showing a rigid strip attached to peripheral walls of an electrical connector according to an embodiment of the present invention.
Figure 2:
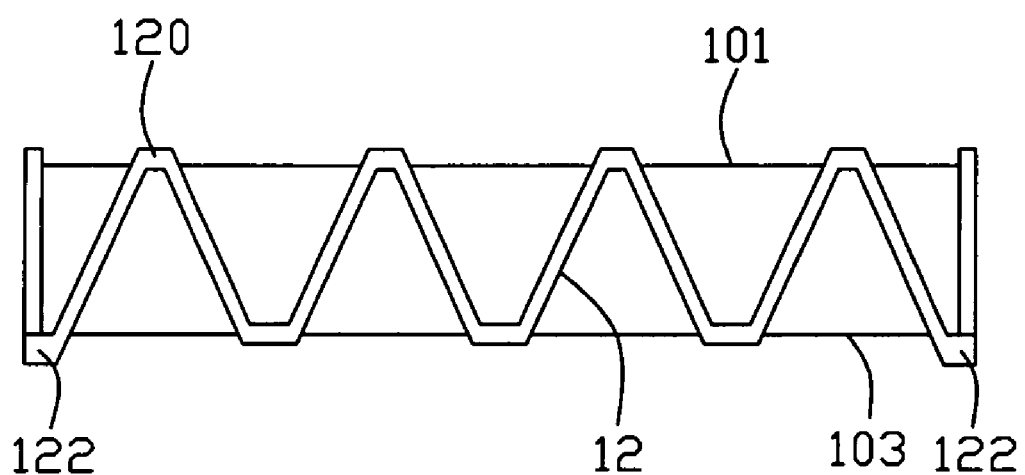
FIG. 2 is a schematic, side view of the electrical connector of FIG. 1.

Referring to FIGS. 1 to 2, an electrical connector according to an embodiment of the present invention is shown to include an insulative housing 10 adapted to engage conductive terminals (not shown, as known in the prior art), and a rigid strip 12 attached to and configured to surround peripheral outer walls of the insulative housing 10. The rigid strip 12 may be a part of the insulative housing by a suitable molding process. The insulative housing 10 has a base with the peripheral outer walls, and defines an IC package mating surface 101 adapted to mate with an IC package (not shown, as known in the prior art), and an opposite substrate mounting surface 103 adapted to face a substrate (not shown, as also known in the prior art). The rigid strip 12 has a substantially wavy shape, arranged in a continuous or uncontinuous manner. In this embodiment, the rigid strip 12 has a continuous strip in a substantially saw teeth or zigzag shape, which includes a plurality of identical units with each shaped as a triangular tooth. However, in other embodiments, the unit of the rigid strip 12 may have other suitable shape, such as in a square, round shape or etc., and the rigid strip 12 may includes different units, with a selected one or ones shaped as triangular, square or round teeth, and etc, all of which are herein referred to as "the rigid strip in a substantially wavy shape".

Such a rigid strip 12 forms a first series of spaced protrusion portions 120 on a top section thereof, and a second series of spaced protrusion portions 122 on a bottom section thereof. The first series of spaced protrusion portions 120 is arranged to extend above the IC package mating surface 101 so as to define a receiving cavity therebetween for receiving the IC package therein. In this embodiment, the spaced protrusion portions 120 in the first series are identical, and placed in a coplanar manner. However, in alternative embodiments, certain protrusion portions 120 may be different, and not placed in a common plane with respect to other protrusion portions 120 in the same first series according to some applications. The second series of spaced protrusion portions 122 is arranged to extend below the substrate mounting surface 103, and at least four protrusion portions 122 adjacent four bottom corners of the insulative housing 10 are disposed in a substantially coplanar manner while having their heights thereof greater than those of the remaining protrusion portions 122 respectively so as to function as standoffs. In this embodiment, all of the spaced protrusion portions 122 in the second series have a common height to be placed in a substantially coplanar manner. Each of the protrusion portions 120 or 122 may be formed as a point, line or surface according to different embodiments.

From the above, it can been seen that, since the rigid strip 12 is directly attached to the peripheral outer walls of the insulative housing 10, such a configuration and shape of the rigid strip will have the function of reinforcing the insulative housing 10 while not taking up much more "real estate" of the substrate, which is allotted for active and/or positive components to be equipped thereon. Further, such a wavy shape of the rigid strip 12 will rapidly reduce the manufacturing cost.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical connector comprising:
    an insulative housing adapted to engage conductive terminals, the insulative housing having peripheral walls, an integrated circuit (IC) package mating surface and a substrate mounting surface opposite to the IC package mating surface;
    a rigid continuous strip in a substantially wavy shape, the continuous strip attached to and
configured to surround the peripheral walls of the insulative housing, the continuous strip having a first series of spaced protrusion portions extending above the IC package mating surface so as to define a receiving space therebetween for receiving an IC package, and a second series of spaced protrusion portions extending below the substrate mounting surface so as to define stand-offs wherein at least four spaced protrusion portions in the second series around four corners of the insulative housing are disposed in a substantially coplanar manner and extend beyond the remaining protrusion portions in the second series respectively.

2. The electrical connector of claim 1, wherein the rigid strip is of a substantially zigzag shape.

3. The electrical connector of claim 1, wherein the rigid strip is arranged in a continuous manner.

4. The electrical connector of claim 1, wherein the rigid strip is a part of the insulative housing.

5. An electrical connector assembly comprising:
    an insulative housing defining opposite integrated circuit (IC) package mating surface and substrate mounting surface, and a plurality of vertical side walls located therebetween; and
    a rigid continuous fence-like frame surrounding said housing and defining a plurality of vertical peripheral protrusions abutting against the corresponding vertical side walls, respectively; wherein
    the peripheral protrusions extend above the IC package mating surface so as to form a receiving space for the IC package therein; wherein
    said frame extends below the substrate mounting surface to form at least one standoff.

6. The assembly as claimed in claim 5, wherein said fence-like frame is made from a rigid strip.

7. The assembly as claimed in claim 5, wherein said frame is essentially of a single wavy configuration.

8. The assembly as claimed in claim 5, wherein there are four of said standoffs formed by said frame on four corners of said substrate mounting surface.

9. An electrical connector assembly comprising:
    an insulative housing defining opposite integrated circuit (IC) package mating surface and substrate mounting surface, and a plurality of outward facing vertical side walls located therebetween; and
    a rigid rail surrounding said housing in a continuous sinusoidal manner which abuts corresponding vertical walls;
    said rail extends beyond the mating surface to form a receiving area for the IC package; and
extends down beyond and/or is flush with the mounting surface; wherein
said rail occupies a minor portion of surface area defining each vertical side wall, such that the greater portion of each outward facing side wall is exposed.

10. The electrical connector assembly as claimed in claim 9, wherein said rail laterally extends along the vertical side walls in a symmetrical manner with regard to a mid-level of said vertical side wall.

11. The electrical connector assembly as claimed in claim 9, wherein said rail is essentially of a single wavy configuration symmetrical with regard to a mid-level of said vertical side wall.

* * * * *